US011232970B2

(12) United States Patent
Hooper

(10) Patent No.: US 11,232,970 B2
(45) Date of Patent: *Jan. 25, 2022

(54) SEMICONDUCTOR DEVICE RELEASE DURING PICK AND PLACE OPERATIONS, AND ASSOCIATED SYSTEMS AND METHODS

(71) Applicant: Micron Technology, Inc., Boise, ID (US)

(72) Inventor: Andy E. Hooper, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

This patent is subject to a terminal disclaimer.

(21) Appl. No.: 16/452,374

(22) Filed: Jun. 25, 2019

(65) Prior Publication Data

US 2019/0311939 A1   Oct. 10, 2019

Related U.S. Application Data

(62) Division of application No. 15/290,234, filed on Oct. 11, 2016, now Pat. No. 10,340,173.

(51) Int. Cl.
*H01L 21/683* (2006.01)
*H01L 21/67* (2006.01)

(52) U.S. Cl.
CPC .... *H01L 21/6838* (2013.01); *H01L 21/67132* (2013.01)

(58) Field of Classification Search
CPC .............. H01L 21/67132; H01L 21/6838
See application file for complete search history.

(56) References Cited

U.S. PATENT DOCUMENTS

| 4,859,269 | A  | 8/1989  | Nishiguchi       |
| 4,990,051 | A  | 2/1991  | Safabakhsh et al. |
| 5,169,196 | A  | 12/1992 | Safabakhsh       |
| 5,589,029 | A  | 12/1996 | Matsui et al.    |
| 6,201,306 | B1 | 3/2001  | Kurosawa et al.  |
| 6,513,796 | B2 | 2/2003  | Leidy et al.     |
| 6,774,011 | B2 | 8/2004  | Nakazawa et al.  |
| 7,470,120 | B2 | 12/2008 | Cheung           |
| 7,665,204 | B2 | 2/2010  | Cheung et al.    |
| 7,757,742 | B2 | 7/2010  | Cheung et al.    |
| 8,142,611 | B2 | 3/2012  | Shibata et al.   |
| 8,470,130 | B2 | 6/2013  | Chong et al.     |

(Continued)

FOREIGN PATENT DOCUMENTS

WO   2014/186337 A1 * 11/2014

*Primary Examiner* — Carl J Arbes
(74) *Attorney, Agent, or Firm* — Perkins Coie LLP

(57) ABSTRACT

Systems and methods for releasing semiconductor devices during pick and place operations are disclosed. A representative system for handling semiconductor dies comprises a support member positioned to carry at least one semiconductor die releasably attached to a support substrate. The system further includes a picking device having a pick head coupleable to a vacuum source and positioned to releasably attach to the semiconductor die at a pick station. The system still further includes a release station having a fluid delivery device coupleable to a source of release fluid, the fluid delivery device having an exit positioned to direct release fluid toward a semiconductor die carried by the support member at the release station.

14 Claims, 4 Drawing Sheets

(56) References Cited

U.S. PATENT DOCUMENTS

| | | |
|---|---|---|
| 9,530,751 B2 | 12/2016 | Nakano et al. |
| 2002/0019074 A1 | 2/2002 | Nakazawa et al. |
| 2002/0069952 A1 | 6/2002 | Kurosawa |
| 2009/0057001 A1 | 3/2009 | Jung et al. |
| 2009/0288858 A1 | 11/2009 | Fan et al. |
| 2011/0074026 A1 | 3/2011 | Shim et al. |
| 2011/0140287 A1 | 6/2011 | Bathan et al. |
| 2015/0214090 A1 | 7/2015 | Jin et al. |
| 2018/0374788 A1 | 12/2018 | Nakagawa et al. |

\* cited by examiner

SEMICONDUCTOR DEVICE RELEASE DURING PICK AND PLACE OPERATIONS, AND ASSOCIATED SYSTEMS AND METHODS

CROSS-REFERENCE TO RELATED APPLICATION

This application is a division of U.S. patent application Ser. No. 15/290,234, filed Oct. 11, 2016, now U.S. Pat. No. 10,340,173, which is incorporated herein by reference in its entirety.

TECHNICAL FIELD

The present technology is directed generally to releasing semiconductor devices during pick and place operations, and associated systems and methods.

BACKGROUND

Packaged semiconductor dies, including memory chips, microprocessor chips, and imager chips, typically include a semiconductor die, mounted on a substrate and (optionally) encased in a plastic protective covering. The die includes functional features, such as memory cells, processor circuits, and/or imager devices, as well as bond pads electrically connected to these functional features. The bond pads can be electrically connected to outside terminals to allow the die to be connected to other devices, e.g., higher level circuitry.

During a conventional manufacturing process, many semiconductor dies are manufactured together on a semiconductor wafer, which is then singulated or diced to form individual dies. Once the dies have been singulated, they are typically handled by "pick and place" machines that remove the individual dies and place them at processing stations or other locations for additional manufacturing steps. As semiconductor devices have become smaller and smaller, the ability to handle individual dies without breaking them, particularly during the pick and place process, has become more challenging. Accordingly, there remains a need in the art for pick and place devices that can handle extremely thin semiconductor dies, without breaking or otherwise damaging the dies.

DETAILED DESCRIPTION

Specific details of several embodiments of systems having features for releasing semiconductor devices from dicing frames, or other support substrates, are described below. In several of the embodiments described below, a release fluid is directed toward an interface between the semiconductor device and the underlying support substrate to loosen or release the bond(s) holding the semiconductor device to the support substrate, before the semiconductor device is removed from the support substrate. For example, particular embodiments include directing a gaseous or liquid fluid toward the interface, to loosen a bond between a semiconductor die and an underlying layer of dicing tape. When a pick and place system lifts the die from the dicing tape, the die is less likely to break, due to the preceding process of loosening the bond. Accordingly, the yield of intact dies or other semiconductor devices handled by systems configured in accordance with the present technology is expected to be greater than for conventional systems.

The term "semiconductor device" generally refers to a solid state device that includes one or more semiconductor materials. A semiconductor device can include, for example, a wafer or a die that is singulated from a wafer. Throughout the present disclosure, semiconductor devices are generally described in the context of semiconductor dies; however, semiconductor devices are not limited to semiconductor dies alone.

The term "semiconductor device assembly" generally refers to an arrangement with one or more semiconductor devices incorporated into a common assembly, for example, a common package. In particular embodiments, the package can include a housing or casing that partially or completely encapsulates at least one semiconductor device. In some instances, the terms "upper" and/or "lower" may be used to refer to relative directions or positions of features of the semiconductor devices and assemblies, in view of the orientations shown in the Figures. These terms, however, should be construed broadly to include devices having other orientations, such as inverted or inclined orientations, or orientations for which top/bottom, over/under, above/below, up/down and/or left/right can be interchanged.

Figure 1:
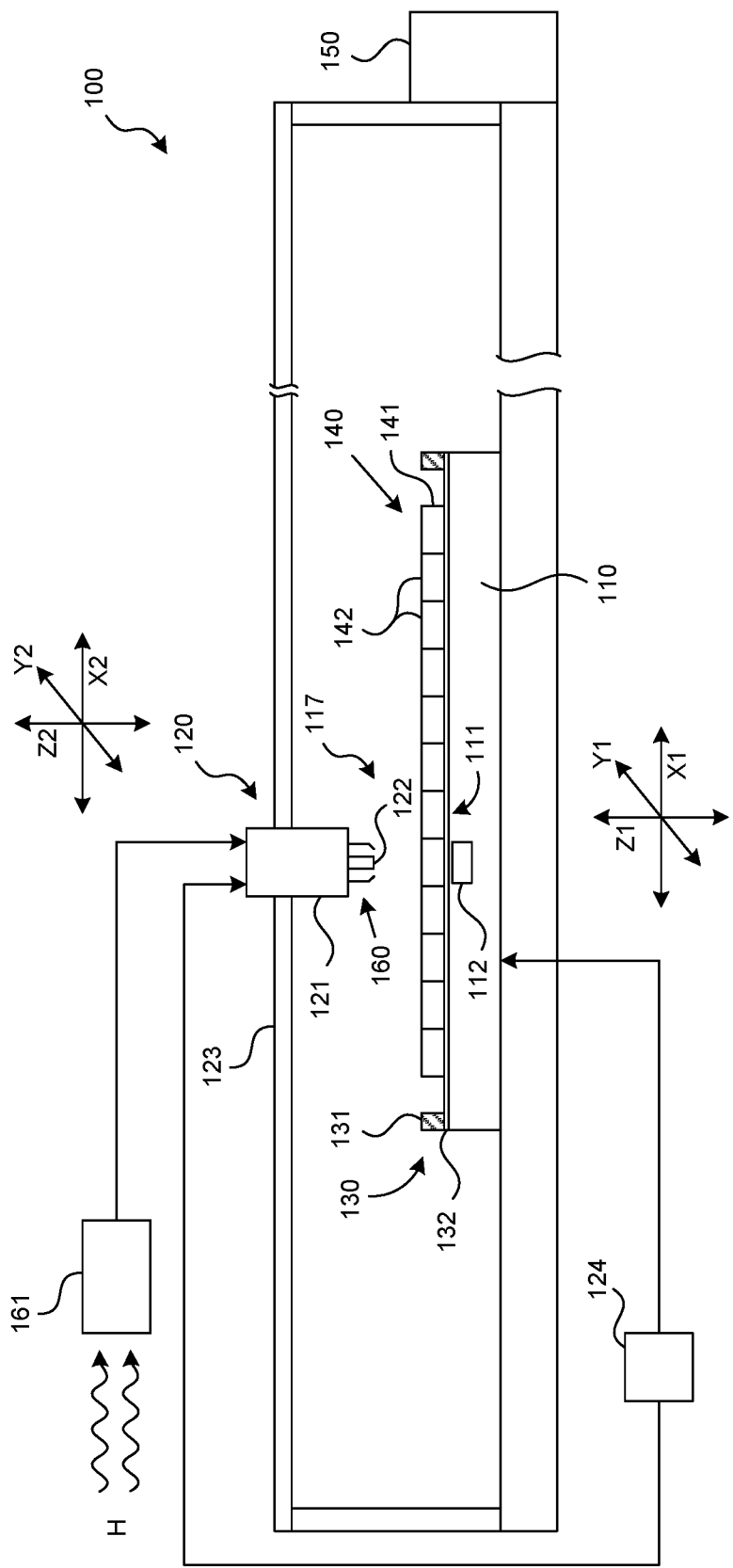
FIG. 1 is a partially schematic side elevation view of a system having a picking device configured in accordance with an embodiment of the present technology.

FIG. 1 is a partially schematic, side elevation view of a system 100 configured to "pick and place" semiconductor devices in accordance with embodiments of the present technology. In general terms, the system 100 includes a picking device 120 that removes individual semiconductor devices 140 (e.g., semiconductor dies 142) from a support substrate 130 at a pick station 111. The system 100 further includes a fluid delivery device 160 that aids in loosening, releasing or at least partially releasing the semiconductor dies 142 from the support substrate 130 prior to the picking device 120 removing the semiconductor dies 142. The release process is performed at a release station 117 which, in an embodiment shown in FIG. 1, is co-located with the pick station 111. Further details of the illustrated representative system and associated methods are described below.

In a particular embodiment, the system 100 includes a support member 110 that carries the support substrate 130. The support substrate 130 can include a dicing frame 131 that carries a sheet of dicing tape 132. The semiconductor device 140 is releasably attached to the dicing tape 132. The dicing tape 132 can include a UV-cured, cross-linked material that engages with the semiconductor device via electrostatic forces, mechanical forces (by conforming to topographical features on the backside of the semiconductor device 140), and/or other forces. In a particular embodiment, the semiconductor device 140 includes a semiconductor wafer 141 that in turn includes multiple semiconductor dies 142. The picking device 120 can be configured to pick up individual semiconductor dies 142 and remove them from the support substrate 130. Accordingly, the individual semiconductor dies 142 are typically diced or singulated from each other before the picking device 120 performs a pick and place operation.

The picking device 120 can include a pick head 121 that in turn has a pick tip 122 which contacts the semiconductor dies 142 prior to removal. The pick head 121 can be coupled to a vacuum source 124, which allows the pick tip 122 to releasably engage with individual dies 142 via a suction or vacuum force. Prior to lifting an individual die 142 away from the support substrate 130, an ejector device 112 can push the die 142 upwardly relative to its neighbors, to facilitate removing just one die 142 at a time.

In order to remove individual dies 142 one at a time, the system 100 is configured to provide for relative movement between the support member 110 and the pick head 121. Accordingly, the support member 110 can be actuated to translate relative to multiple axes, e.g., three transverse axes indicated by reference numerals X1, Y1 and Z1. In addition to or in lieu of the support member 110 moving, the picking device 120 can move, e.g., via a guide 123 or other suitable device. Accordingly, the pick tip 122 can translate along multiple axes, e.g., along three axes, as indicated by reference numbers X2, Y2 and Z2. The removed dies can be placed at another location within the overall system 100, or can be transferred outside the system 100.

The system 100 can include components for selectively holding the semiconductor device 140 in position, and releasing the semiconductor device 140. For example, the vacuum source 124 described above can be coupled to the support member 110 to hold the support substrate 130 in position relative to the support member 110, in addition to supplying a vacuum force to the pick tip 122. In other embodiments, the system 100 can include multiple vacuum sources, e.g., one to hold the support substrate 130 in position, and another to hold the semiconductor die in contact with the pick tip 122. In either embodiment, the system 100 can further include a release fluid source 161 that supplies a release fluid to the fluid delivery device 160 for releasing individual dies 142 from the support substrate 130. In particular embodiments, the release fluid source 161 can also heat the release fluid, as indicated by arrows H (and/or can contain a pre-heated release fluid), to facilitate loosening the individual semiconductor dies 142 from the support substrate 130. Further details of the release operation are described later with reference to FIGS. 2 and 3.

The system 100 can further include a controller 150 programmed with instructions for directing the operations and motions carried out by the support member 110, the picking device 120, the ejector device 112, and/or the fluid delivery device 160. Accordingly, the controller 150 can include a processor, memory, input/output devices, and a computer-readable medium containing instructions for performing some or all of the tasks described herein.

Figure 2:
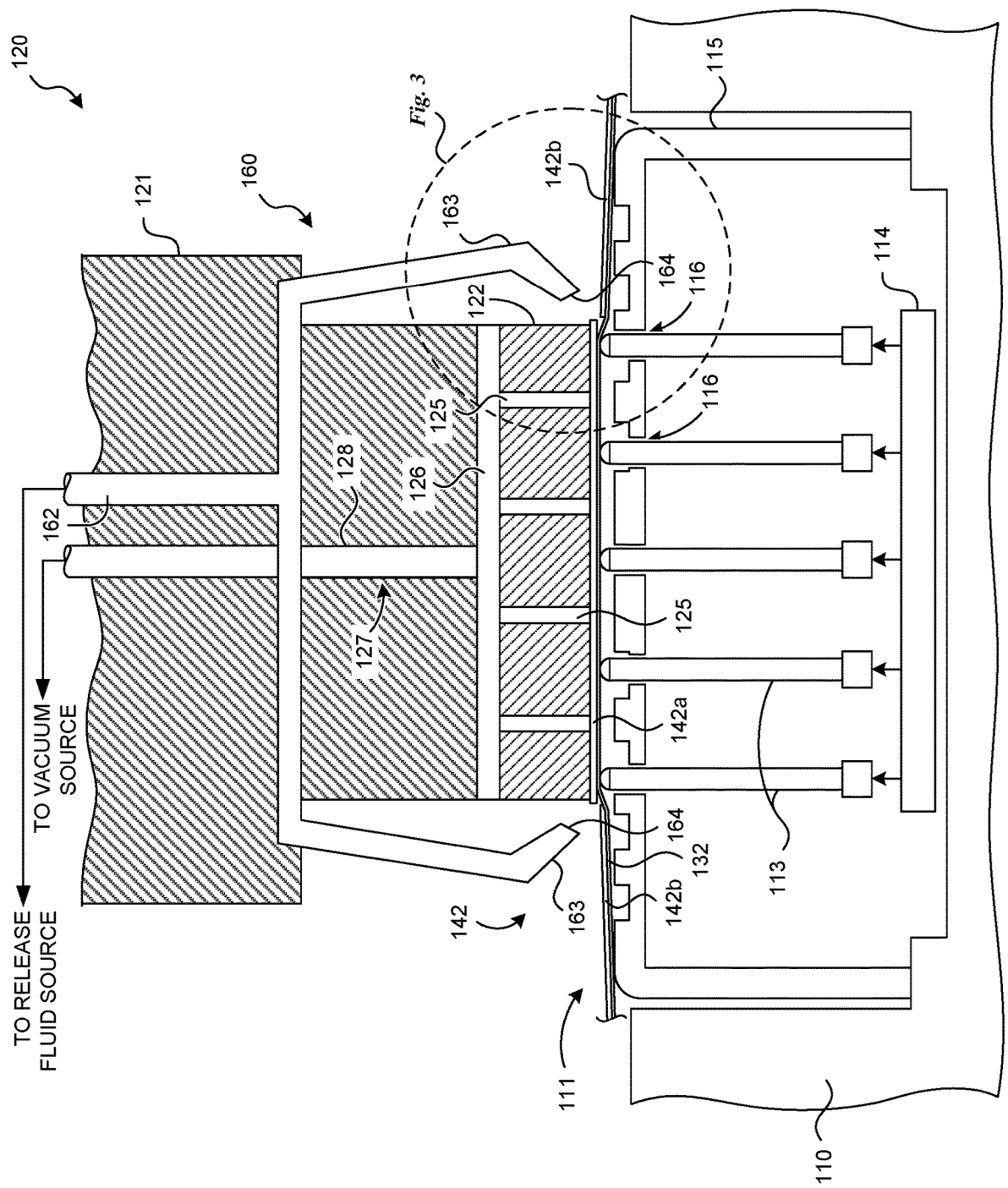
FIG. 2 is an enlarged view of a portion of the system shown in FIG. 1, illustrating details of an arrangement that includes a fluid for releasing dies from an underlying support substrate, in accordance with an embodiment of the present technology.
Figure 3:
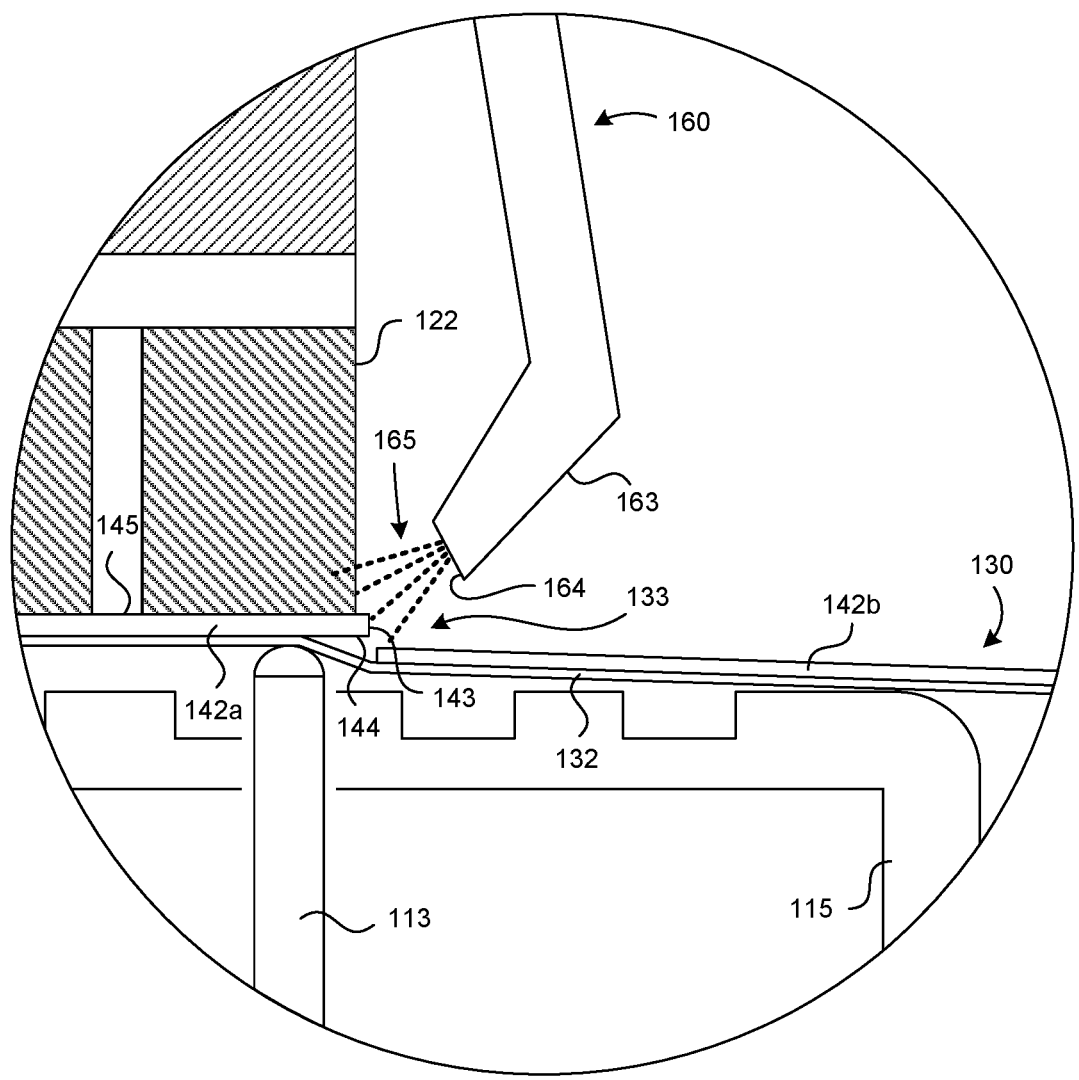
FIG. 3 is an enlarged view of an interface between an individual die and an associated support substrate, and a fluid delivery system configured in accordance with an embodiment of the present technology.

FIG. 2 is a partially schematic, cross-sectional illustration of a portion of the picking device 120 and the support member 110 shown in FIG. 1. FIG. 2 illustrates multiple dies 142, including a first die 142a (in position at the pick station 111) and two neighboring second dies 142b, all attached to the support member 130, e.g., the dicing tape 132. At the pick station 111, the support member 110 includes a dome 115 over which the dicing tape 132 and die 142 are positioned. The ejector device 112 can include one or more ejector pins 113 that are actuated to extend upwardly through corresponding apertures 116 in the dome 115, via one or more actuators 114. When the ejector pins 113 are extended upwardly (as shown in FIG. 2), the first die 142a is raised relative to the neighboring second dies 142b. This arrangement can make it easier for the pick head 121 to retrieve one die at a time.

The tip 122 of the pick head 121 can include multiple vacuum ports 125 coupled to the vacuum source 124 (FIG. 1) via a vacuum flow path 127. The vacuum ports 125 can be individual passages (as shown in FIG. 2), or can have other configurations. For example, the tip 122 can include or be formed from a foam that is porous so as to allow vacuum forces to act on the first die 142a. The vacuum flow path 127 can include a plenum 126 in fluid communication with multiple vacuum ports 125, and a conduit or other passageway 128 that extends from the vacuum ports 125 to a suitable point for a connection to the vacuum source 124. When the vacuum source 124 is activated, the first die 142a is releasably secured in contact with the tip 122 of the pick head 121 via the vacuum ports 125.

The fluid delivery device 160 can include one or more nozzles 163 having corresponding nozzle exits 164 positioned to direct a release fluid toward the tip 122, the dicing tape 132 and/or the first die 142a. As shown in greater detail in FIG. 3, the first die 142a includes a lower surface 144 releasably attached to the dicing tape 132, an upper surface 145 releasably held against the pick head tip 122 via the vacuum source described above, and an outwardly facing edge 143 between the lower surface 144 and the upper surface 145. The fluid delivery device 160 can include two opposing nozzles 163 (one of which is visible in FIG. 3), each facing inwardly toward an interface 133 between the first die 142a and the dicing tape 132. The nozzles 163 can deliver a quantity of release fluid 165 to the interface 133 via the nozzle exits 164. Because the ejector pins 113 elevate the first die 142a relative to the neighboring second die 142b, the edge 143 and/or the lower surface 144 of the first die 142a are exposed. The release fluid 165 can accordingly impinge on the edge 143 of the first die 142a, and/or on the exposed lower surface 144 of the first die 142a. At these locations, the release fluid 165 can loosen the attachment forces between the first die 142a and the dicing tape 132, and/or can otherwise weaken the bond between these two components so that the pick head 121 can more easily lift the first die 142a away from the dicing tape 132 without breaking the first die 142a.

The release fluid 165 can include one or more of a variety of suitable constituents. For example, the release fluid 165 can include water and/or an alcohol. The alcohol in turn can include ethanol, propanol, isopropanol and/or another suitable composition. In general, the release fluid 165 does not include a surfactant, because surfactants tend to leave a film or residue on the die 142a after the pick and place operation has concluded. In particular embodiments, the release fluid 165 can be in a liquid state, and in other embodiments, the release fluid 165 can be in a gaseous state. For example, when the release fluid includes water, the water can be heated to steam before being directed to the interface 133 shown in FIG. 3. In at least some embodiments, it is expected that heating the release fluid 165 will cause the release fluid 165 to more readily break the electrostatic, mechanical and/or other bonds between the support substrate 130 and the first die 142a. In addition, a gaseous release fluid 165 may be more likely to penetrate between the first die 142a and the support member 130 at the interface 133, and be less likely to "bead up" or otherwise resist entry into the interface 133 as a result of surface tension. In any of these embodiments, the release fluid 165 can include a combination of constituents. For example, the release fluid can include a mixture of air and water vapor.

The operator can control the composition of the release fluid 165, depending on the particular application. For example, in some applications a release fluid having a higher water content (e.g., higher humidity) may produce better results than a release fluid having a lower water content.

In general, it is expected that the foregoing processes can be conducted within the flow of existing pick and place processes, either without modification or with relatively minor modifications. For example, it is not expected that any residual release fluid remaining after the pick and place operation will interfere with subsequent operations, particularly operations that include heating (which are expected to vaporize any residual fluid). It is also expected that the presence of the release fluid will not adversely affect humidity levels typical for semiconductor fab operations. In instances for which the residual fluid is expected to cause an unwanted increase in humidity, the system can include a system-specific dryer (e.g., a heater or additional vacuum facility), and/or the environmental controls of the clean room or other space in which the system operates can be adjusted to account for the additional humidity.

It is expected that the foregoing processes can be implemented for any wafers that have, or are expected to have, dies that are difficult to remove. In at least some instances, the processes are performed for all wafers of a particular type, since the operator may not know in advance which individual wafers will require or benefit from the removal fluid. In many instances, the singulated dies do not extend to the edges of the wafer. Accordingly, the process may start with a die located at the center, or within a central portion, of the wafer. If it is difficult to access the edges of such a die (due to the presence of adjacent dies), one die may be "sacrificed" (e.g., removed, but damaged or broken as a result of being removed) to expose the edges and/or lower surfaces of the neighboring dies, which can then be more readily removed via the release fluid.

In an embodiment described above with reference to FIGS. 1-3, the fluid delivery device 160 operates on the first die 142a at the same location that the pick head 121 engages the first die 142a. In still a further particular aspect of this embodiment, the pick head 121 engages with the first die 142a before the fluid delivery device 160 directs the release fluid 165 toward the interface 133. In other embodiments, the foregoing steps can be performed in different orders and/or at different locations. For example, the release fluid 165 can be directed toward the interface 133 before the pick head 121 engages with the first die 142a. In at least some embodiments, it is expected that engaging the pick head 121 with first die 142a before directing the release fluid 165 will reduce the likelihood for the first die 142a to move in an uncontrolled manner after being loosened. In still another embodiment, the release fluid 165 can be directed to the interface 133 at a location different than the one at which the pick head 121 engages with the first die 142a, as described in further detail below with reference to FIG. 4.

Figure 4:
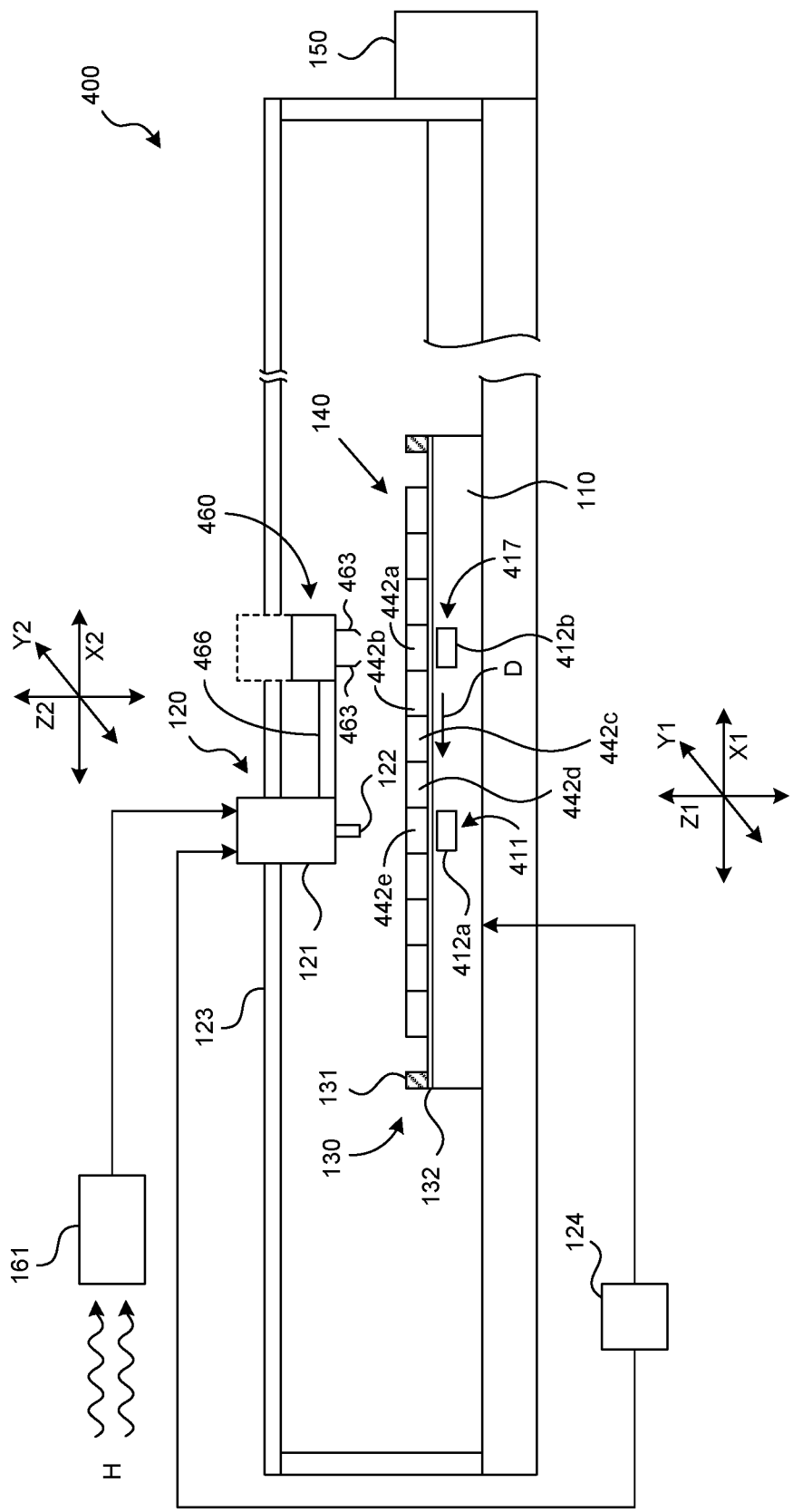
FIG. 4 is a partially schematic, side elevation view of a system having a release station spaced apart from a pick station, in accordance with an embodiment of the present technology.

FIG. 4 is a partially schematic side elevation view of a representative system 400 that includes a pick station 411 and a separate release station 417, each of which supports a different operation. The pick station 411 can include a first ejector device 412a, and the release station 417 can include a second ejector device 412b, both of which operate in generally the same manner as discussed above with reference to the ejector device 112 shown in FIGS. 1 and 2. The system 400 can further include a fluid delivery device 460 that is aligned with the release station 417, not the pick station 411. In one representative embodiment, the fluid delivery device 460 is coupled or connected to the pick head 121, e.g., via an extension 466. Accordingly, both the pick head 121 and the fluid delivery device 460 follow similar or identical parallel paths in the X2 and Y2 directions. In another embodiment, shown in dashed lines in FIG. 4, the extension 466 can be eliminated, and the fluid delivery device 460 can move independently of the pick head 121 in the X2 and Y2 directions, e.g., via the same guide 123 used by the pick head 121, or via a separate guide. In either embodiment, the fluid delivery device 460 can include one or more nozzles 463 that direct a release fluid to a first die 442a at the release station 417. The second ejector device 412b can elevate the first die 442a relative to its neighbors to allow the release fluid to access the interface 133, generally in the manner described above with reference to FIG. 3.

After the system 400 delivers the release fluid to the first die 442a, the system 400 can advance the first die 442a, as indicated by arrow D, to the pick station 411, where the pick head 121 removes the first die 442a from the underlying support substrate 130. During the time it takes for the first die 442a to travel from the release station 417 to the pick station 411, the release fluid can operate to release the bond(s) connecting the first die 442a to the support substrate 130. This additional residence time can allow the release fluid to more completely release the bond(s), without delaying the picking process, because, during this time, the pick head 121 can remove the dies 442b, 442c, 442d, 442e ahead of the first die 442a. These dies will have already been treated at the release station 417. In a particular embodiment, the motion of the pick head 121 and the fluid delivery device can be coordinated so that while the fluid delivery device 460 is delivering release fluid to one die at the release station 417, the pick head 121 is simultaneously removing another die at the pick station 411. In other embodiments, the pick action of the pick head 121 and the fluid delivery action of the fluid delivery device 460 can be coordinated, but not simultaneous.

One feature of at least some of the systems and methods described above with reference to FIGS. 1-4 is that a release fluid is used to at least weaken (e.g., weaken or break) the bonds between a semiconductor die or other semiconductor device, and an underlying dicing tape or other support substrate. By at least reducing these forces, the likelihood for the picking device to consistently remove the semiconductor dies without breaking or otherwise damaging them, can be significantly improved. This is particularly advantageous in situations where the semiconductor dies are extremely thin (e.g., 100 microns thick, or thinner). Accordingly, the yield for such thin dies can be significantly improved. This arrangement can provide advantages in a production environment, in which high yield has a clear production benefit, and/or a research environment, in which the number of available die for testing may be limited, and each broken or damaged dies can significantly impede advances in the associated research.

From the foregoing, it will be appreciated that specific embodiments of the present technology have been described herein for purposes of illustration, but that various modifications may be made without deviating from the scope of the present technology. For example, in particular embodiments, the details of the picking device and/or the fluid delivery device may be different than those shown in the foregoing Figures. In particular embodiments, the fluids used to release individual dies from the associated dicing tape, or other supporting component, may have compositions other than those expressly disclosed herein. The release fluid can be delivered via two nozzles, each having a corresponding fluid exit, and in other embodiments, can be delivered via any suitable number of nozzles and/or fluid exits, e.g., a single nozzle, more than two nozzles, a single fluid exit, or more than two fluid exits. The support substrate can be configured to support the semiconductor device via a dicing tape, as described in connection with several embodiments above, or other releasable media or mechanisms. In particular embodiments (e.g., when the support substrate includes a dicing tape), the forces released by the release fluid are primarily electrostatic and/or mechanical forces, and in other embodiments, the forces may be of different types, in addition to or in lieu of electrostatic and/or mechanical forces. In any of these embodiments, the forces may vary depending on factors that include the type and/or age of the support substrate, the roughness of the wafer backside, the presence or absence of residual seed layer material, the nature of the process most recently completed on the wafer, and/or other factors. The pick-and-place operation can be performed immediately after dicing, or in association with other processes, e.g., thermocompression bonding, die sorting, and/or flip chip tool operations.

Whether the dies are exposed to the release fluid and removed from the support substrate at the same location or at different locations, the operation can be controlled (e.g., by an automated controller) so that the release fluid has sufficient time to loosen the bonds at the interface. It is expected that a few seconds will be sufficient in most embodiments, but the residence time may be different in different embodiments. The system may be used just prior to a die packaging operation, and/or at any suitable step in the fabrication process for which a pick and place operation is used.

Certain aspects of the technology described in the context of particular embodiments may be combined or eliminated in other embodiments. Further, while advantages associated with certain embodiments have been described in the context of those embodiments, other embodiments may also exhibit such advantages and not all embodiments need necessarily exhibit such advantages to fall within the scope of the present technology. Accordingly, the present disclosure and associated technology can encompass other embodiments not expressly shown or described herein.

I claim:

1. A system for handling semiconductor dies, comprising:
a support member positioned to carry at least one semiconductor die releasably attached to a support substrate;
a picking device having a pick head coupleable to a vacuum source and positioned to releasably attach to the semiconductor die at a pick station; and
a fluid delivery device coupleable to a source of release fluid, the fluid delivery device having an exit positioned to direct release fluid between a lower surface of the semiconductor die and the support substrate at a release station.

2. The system of claim 1, further comprising the source of release fluid.

3. The system of claim 2, further comprising the release fluid, and wherein the release fluid includes water.

4. The system of claim 2, further comprising the release fluid, and wherein the release fluid includes alcohol.

5. The system of claim 4 wherein the release fluid includes at least one of ethanol, propanol or isopropanol.

6. The system of claim 1 wherein the pick station and the release station are co-located.

7. The system of claim 1 wherein the pick station and the release station are spaced apart from each other.

8. A system for handling semiconductor dies, comprising:
a support member positioned to carry at least one semiconductor die releasably attached to a support substrate;
a picking device positioned at a pick station, the picking device having a pick head coupleable to a vacuum source and positioned to releasably attach to the semiconductor die; and
a fluid delivery device positioned at a release station and coupleable to a source of release fluid, the fluid delivery device having an exit positioned to direct the release fluid between a lower surface of the semiconductor die and the support substrate at the release station.

9. The system of claim 8, further comprising the source of release fluid.

10. The system of claim 9, further comprising the release fluid, and wherein the release fluid includes water.

11. The system of claim 9, further comprising the release fluid, and wherein the release fluid includes alcohol.

12. The system of claim 11 wherein the release fluid includes at least one of ethanol, propanol or isopropanol.

13. The system of claim 8 wherein the pick station and the release station are co-located.

14. The system of claim 8 wherein the pick station and the release station are spaced apart from each other.

* * * * *